US008701283B2

(12) United States Patent
Dundulachi

(10) Patent No.: US 8,701,283 B2
(45) Date of Patent: Apr. 22, 2014

(54) INTEGRATED CAPACITOR HAVING REVERSED PLATES

(75) Inventor: Alessandro Dundulachi, Vimercate (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 403 days.

(21) Appl. No.: 12/972,613

(22) Filed: Dec. 20, 2010

(65) Prior Publication Data

US 2011/0157777 A1  Jun. 30, 2011

(30) Foreign Application Priority Data

Dec. 30, 2009  (IT) .............................. MI2009A2354

(51) Int. Cl.
*H05K 3/02* (2006.01)
*H05K 3/10* (2006.01)

(52) U.S. Cl.
USPC ................ 29/846; 29/25.02; 29/832; 29/848; 438/171; 438/190; 438/210; 438/238; 257/288

(58) Field of Classification Search
USPC ......... 29/25.03, 832, 846, 848; 438/171, 190, 438/210, 238–253, 379, 386–399; 257/288–313
See application file for complete search history.

(56) References Cited

U.S. PATENT DOCUMENTS

| 6,441,419 | B1* | 8/2002 | Johnson et al. ................ 257/296 |
| 2003/0209748 | A1 | 11/2003 | Basceri et al. |
| 2004/0135189 | A1 | 7/2004 | Kiyotoshi |
| 2005/0158983 | A1 | 7/2005 | Hoshi et al. |
| 2006/0014384 | A1 | 1/2006 | Lee et al. |
| 2006/0189069 | A1 | 8/2006 | Coolbaugh et al. |
| 2007/0155091 | A1 | 7/2007 | Park |
| 2008/0048291 | A1* | 2/2008 | Chung et al. .................. 257/532 |

FOREIGN PATENT DOCUMENTS

EP  1548814 A3  6/2005

OTHER PUBLICATIONS

Italian Search Report dated Jun. 25, 2010 from corresponding Italian Application No. MI20092354.
Italian Written Opinion dated Jun. 25, 2010 from corresponding Italian Application No. MI20092354.
Italian Search Report dated Jun. 24, 2010 from related Italian Application No. MI20092353.
Written Opinion dated Jun. 24, 2010 from related Italian Application No. MI20092353.

* cited by examiner

*Primary Examiner* — Peter DungBa Vo
*Assistant Examiner* — Jeffrey T Carley
(74) *Attorney, Agent, or Firm* — Wolf, Greenfield & Sacks, P.C.

(57) ABSTRACT

A method for producing an integrated device including a capacitor. The method includes the steps of providing a functional substrate including functional circuits of the integrated device, forming a first conductive layer including a first plate of the capacitor on the functional substrate, forming a layer of insulating material including a dielectric layer of the capacitor on a portion of the first conductive layer corresponding to the first plate, forming a second conductive layer including a second plate of the capacitor and functional connections to the functional circuits on a portion of the layer of insulating material corresponding to the dielectric layer, forming a protective layer of insulating material covering the second plate and the functional connections, forming a first contact for contacting the first plate, and forming a second contact and functional contacts for contacting the second plate and the functional connections, respectively, through the protective layer.

11 Claims, 8 Drawing Sheets

INTEGRATED CAPACITOR HAVING REVERSED PLATES

CROSS REFERENCE TO RELATED APPLICATIONS

This application claims the priority benefit of Italian patent application number MI2009A002354, filed on Dec. 30, 2009, entitled "Integrated Capacitor Having Reversed Plates," which is hereby incorporated by reference to the maximum extent allowable by law.

BACKGROUND OF THE INVENTION

1. Field of the Invention

An embodiment of the present invention relates to the microelectronics field. More specifically, the present invention relates to integrated capacitors.

2. Discussion of the Related Art

Capacitors are components commonly used in most electronic circuits. Referring in particular to an electronic device being integrated in a chip of semiconductor material, many techniques are known for making the capacitors in the same chip wherein there are made other functional components of the integrated device, being both passive (such as resistors) and active (such as transistors).

For example, (integrated) Metal-Oxide-Metal (MOM) capacitors include two plates of conductive material (typically metal) between which there is grown a thin oxide layer of the metal (having insulating properties) to form a dielectric layer of the capacitor. The MOM capacitors are nowadays the preferred choice in many types of integrated devices for their manufacturing simplicity, even if they need particular manufacturing precautions in order not to damage the thin oxide layer.

On the contrary, (integrated) Metal-Insulator-Metal (MIM) capacitors are formed by two plates of conductive material (typically metal) between which there is deposited a layer of insulating material (for example, Silicon Nitride) to form the dielectric layer of the capacitor. The Silicon Nitride has a high dielectric constant, so that the MIM capacitors have a specific capacitance (per unit area of their plates) being greater than that of the MOM capacitors; this allows making more compact capacitors that, for the same overall capacity, occupy a lower area of the chip than the MOM capacitors do. Furthermore, the MIM capacitors allow integrating other components below them, with a further saving of area of the chip.

In a known structure of such integrated capacitors, a bottom plate is formed from a portion of a metal layer of the chip, being commonly used for distributing signals and/or power supply among functional components of the integrated device, while an upper plate is made within a protective layer (of insulating material) protecting the metal layer wherein there are made the bottom plate and the dielectric layer being formed thereon.

In order to make electrical connections of the top plate and of the bottom plate of the capacitor from a main surface of the chip, in such a structure it is necessary to form electrical connection paths (commonly known as via-holes) by opening corresponding holes (through a masking and etching operation) across the protective layer covering the top plate and bottom plate; therefore, the top plate should have a low thickness, so as to limit as much as possible (but not remove) a difference between an etch depth of the (thicker) protective layer covering the bottom plate and other portions of the metal layer being connected to corresponding functional components of the integrated device, and an etch depth of the (thinner) protective layer on the top plate. Such difference involves, during the etching operation, the high risk of perforating the top plate down to reach the dielectric layer that separates the two plates, thereby causing the breakage of the capacitor. In order to avoid such problem, it is therefore necessary to use detection systems of a checkpoint of the etching operation; however, this requires the use of highly sophisticated and expensive machines. Alternatively, it is possible to use a double masking and etching process with a consequent increase in the production cost of the capacitor and hence of the whole integrated device.

Furthermore, in the state of the art the quality of the dielectric layer is not optimal. In fact, the dielectric layer is made at relatively low process temperatures in order not to damage the bottom plate (typically not more than 400° C.). This has a negative effect on the chemical and mechanical properties of the dielectric layer, such as, for example, the planarity, with a consequent worsening of its insulating properties.

SUMMARY OF THE INVENTION

In its general terms, an embodiment of the present invention is based on the idea of reversing the capacitor plates.

Particularly, several aspects of an embodiment of the invention are set out in the independent claims. Advantageous features of the same solution are set forth in the dependent claims.

More specifically, an embodiment of the invention provides a method for producing an integrated device including a capacitor. The method includes the steps of providing a functional substrate including functional circuits of the integrated device, forming a first conductive layer including a first plate of the capacitor on the functional substrate, forming a layer of insulating material including a dielectric layer of the capacitor on a portion of the first conductive layer corresponding to the first plate, forming a second conductive layer including a second plate of the capacitor and functional connections to the functional circuits on a portion of the layer of insulating material corresponding to the dielectric layer, forming a protective layer of insulating material covering the second plate and the functional connections, forming a first contact for contacting the first plate, and forming a second contact and functional contacts for contacting the second plate and the functional connections, respectively, through the protective layer.

Another embodiment of the invention provides an integrated device including a capacitor. The integrated device includes a functional substrate including functional circuits of the integrated device, a first plate of the capacitor on the functional substrate being obtained from a first conductive layer, a dielectric layer of the capacitor on the first plate, a second plate of the capacitor on the dielectric layer and functional connections to the functional circuits being obtained from a second conductive layer, a protective layer of insulating material covering the second plate and the functional connections, a first contact for contacting the first plate, and a second contact and functional contacts for contacting the second plate and the functional connections, respectively, being formed through the protective layer.

Another embodiment of the invention provides a complex system including one or more of such integrated devices.

BRIEF DESCRIPTION OF THE DRAWINGS

Embodiments of the invention, as well as further features and the advantages thereof, will be best understood with reference to the following detailed description, given purely by way of a non-restrictive indication, to be read in conjunction with the accompanying drawings (wherein corresponding elements are denoted with equal or similar references, and their explanation is not repeated for the sake of exposition brevity). In this respect, it is expressly intended that the figures are not necessarily drawn to scale and that, unless otherwise indicated, they are simply used to conceptually illustrate the described structures and procedures. In particular.

DETAILED DESCRIPTION

The various steps of a production process of an integrated device including a capacitor (for example, of the MIM-type) according to an embodiment of the invention are illustrated in FIG. 1A-1G. In general, the production process is performed at the level of a wafer of semiconductor material, in which identical integrated devices (each one including one or more of such capacitors) are made simultaneously in large numbers in order to be separated at the end through a cutting operation (for simplicity of description, however, in the following reference will be made to only one of such integrated devices).

Figure 1A:
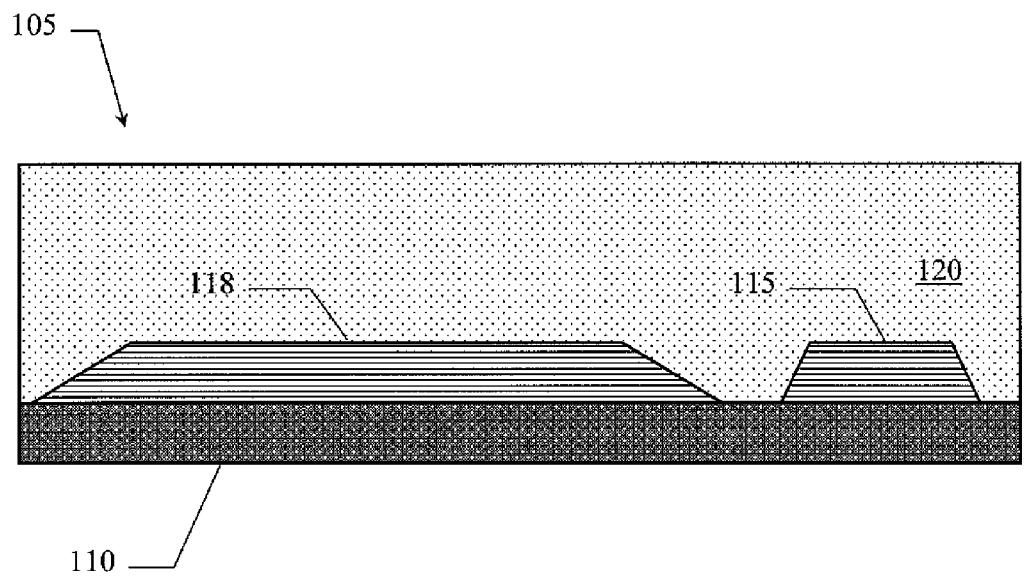
FIG. 1A-1G schematically show various steps of a production process of an integrated device including a capacitor according to an embodiment of the invention, and FIG. 2A-2G schematically show various steps of a production process of an integrated device including a capacitor according to another embodiment of the invention.

Considering in particular FIG. 1A, the description of the production process begins once a functional substrate 105 has been obtained. Such functional substrate 105 includes an operative layer 110 in a lower portion thereof—for example, a silicon substrate on which an epitaxial layer is grown; the operative layer 110 includes functional components of the integrated device (for example, resistors and transistors), being not shown in the figure. Furthermore, the functional substrate 105 includes one or more conductive sectors 115 and a conductive sector 118 (or more) on the operative layer 110, which are derived from a common conductive layer (for example, of polysilicon). Each conductive sector 115 is used for electrically connecting the functional components included in a corresponding portion of the operative layer 110, while the conductive sector 118 is used for electrically contacting a bottom plate of the capacitor (as described in detail in the following). The functional substrate 105 also includes an insulating layer 120, commonly called Pre-Metal Dielectric or PMD, which is deposited on the conductive sectors 115, 118 and on portions of the operative layer 110 being not covered by the conductive sectors 115, 118.

Figure 1B:
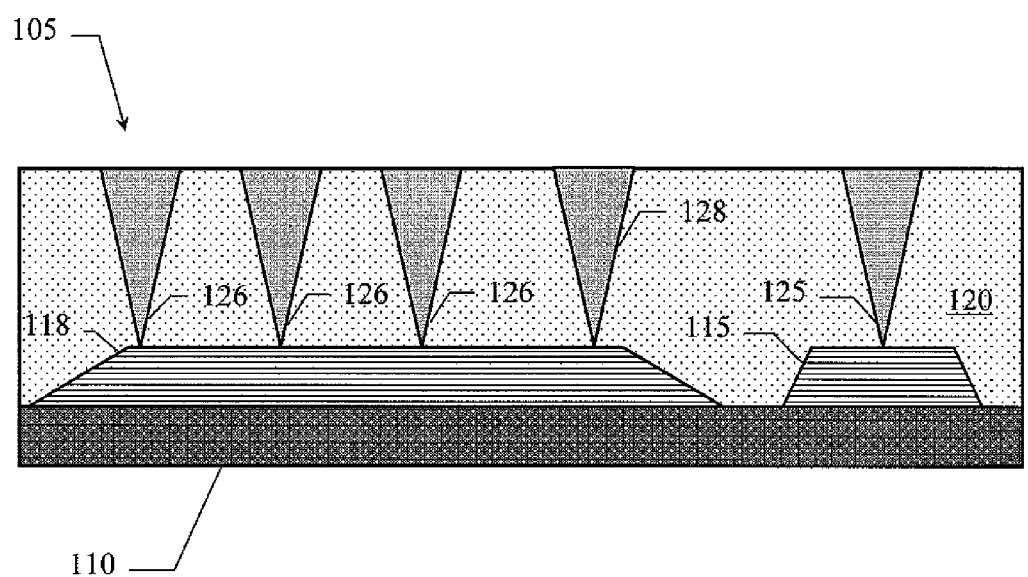

Turning now to FIG. 1B, within the pre-metal layer 120 there are made one or more via-holes 125 (only one shown in the figure) for contacting corresponding conductive sectors 115 (and hence the functional components included in the corresponding portions of the operative layer 110 on which such conductive sectors 115 are formed) to upper layers of the integrated device.

Similarly, within the pre-metal layer 120 there are made one or more via-holes 126 (three in the example in the figure) and a via-hole 128 (or more) for contacting the bottom plate of the capacitor below it and outside it, respectively (as described in detail in the following).

Figure 1C:
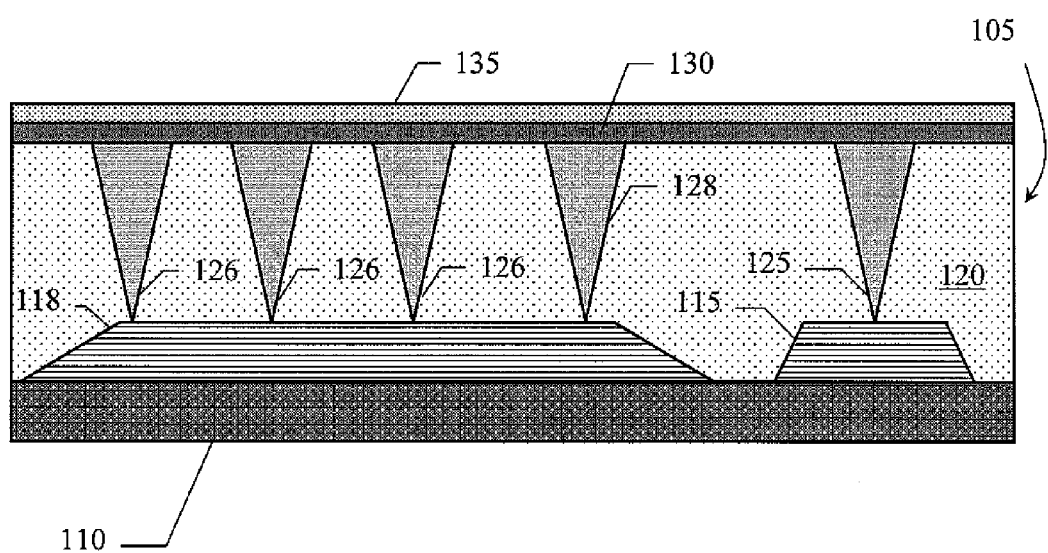

With reference now to FIG. 1C, the production process continues with the deposition on the functional substrate 105 of a layer of metal material 130, on which there is then deposited a layer of insulating material 135 (generally silicon nitride, or an oxygen-nitride-oxygen combination).

Figure 1D:
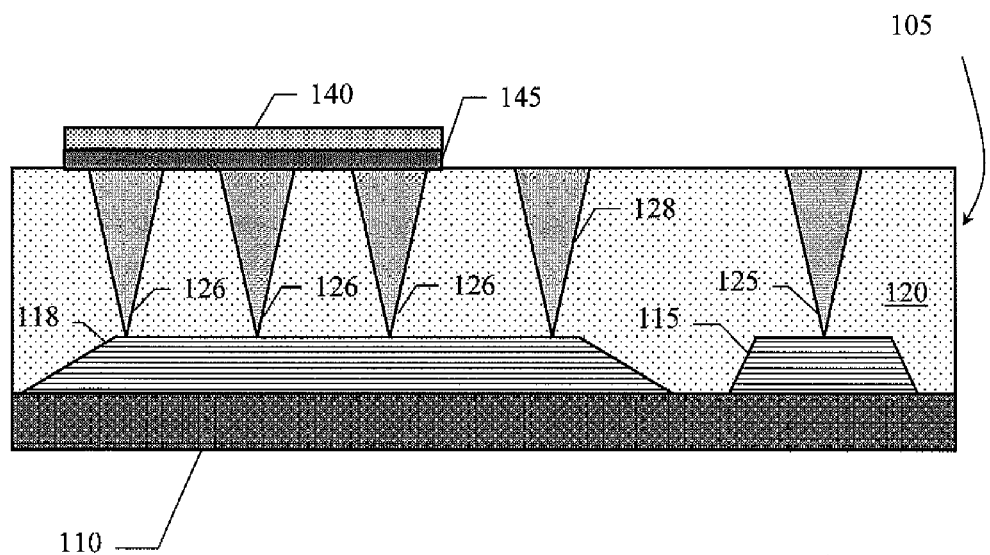

Subsequently, a photo-resist mask, not shown in the figure, is made on the layer of insulating material 135 through a photo-lithographic technique; portions of the layer of insulating material 135 being not protected by the mask are etched—for example, through a dry etching operation. The result of such operation is shown in FIG. 1D, where a corresponding dielectric layer 140 of the capacitor is obtained after the stripping of the mask. As shown in such figure, under the dielectric layer 140 there is thus formed a bottom plate 145 of the capacitor, which contacts the via-holes 126 below it.

Figure 1E:
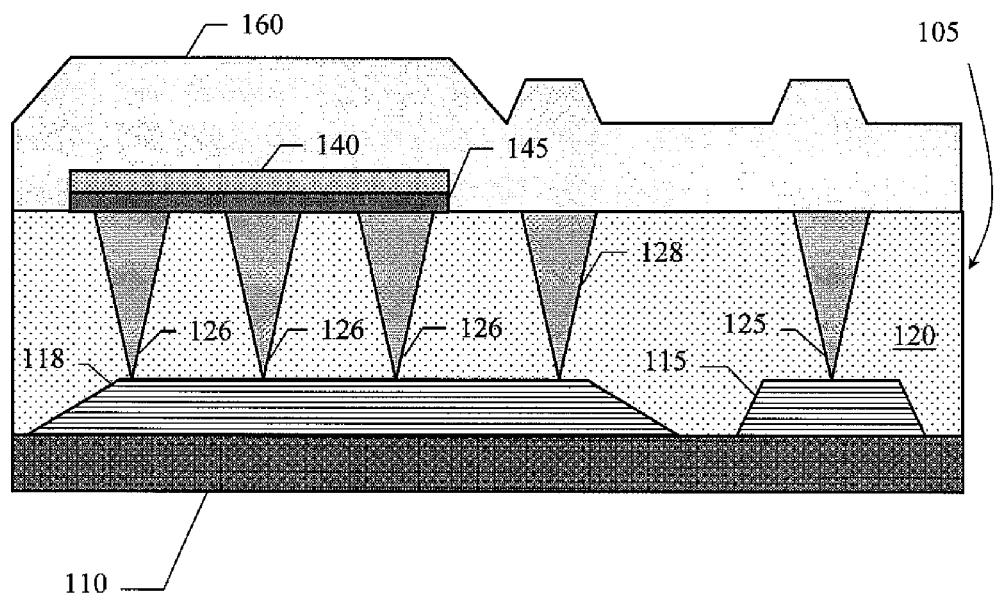

The process continues in FIG. 1E with the deposition of a metal layer 160 on the dielectric layer 140, the via-holes 125, 128 and the exposed surface of the functional substrate 105; then, the metal layer 160 is patterned by a masking and etching operation.

Figure 1F:
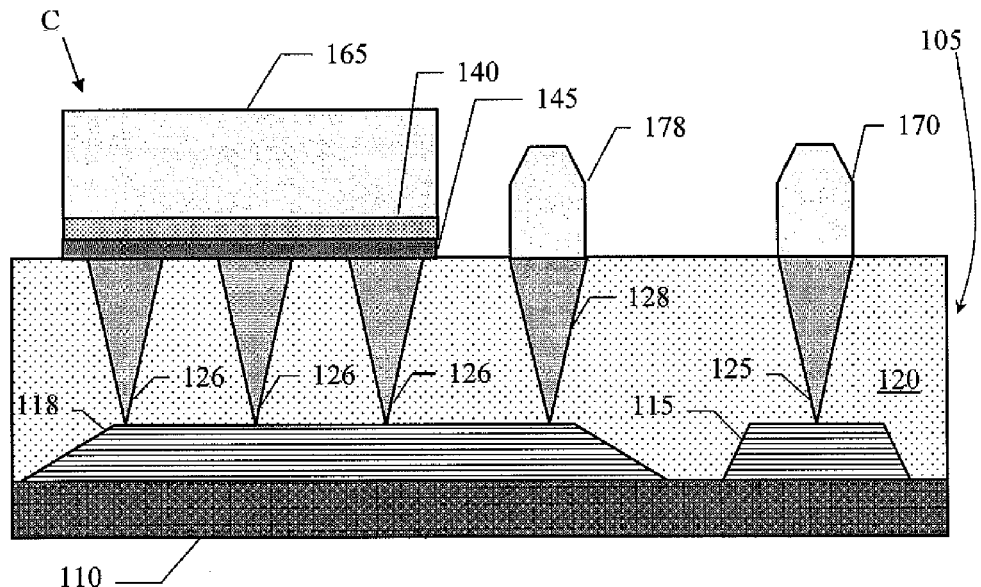

The result of such operation is shown in FIG. 1F, after the stripping of the respective mask. As it can be seen, a residual portion of the metal layer on the dielectric layer 140 defines a top plate 165 of the capacitor. In this way, there is obtained the desired capacitor (indicated with the reference C) that is defined by the bottom plate 145, the top plate 165 and the dielectric layer 140 being interposed between the bottom plate 145 and the top plate 165.

Moreover, further portions of the same metal layer define one or more conductive turrets 170 and a conductive turret 178 (or more) being formed above the corresponding via-holes 125 and 128, respectively. Therefore, the conductive turret 178 turns out to be electrically connected to the lower plate 145 through the via-hole 128, the conductive sector 118, and the via-hole 126. Likewise, the conductive turrets 170 turn out to be electrically connected to corresponding functional components of the operative layer 110 through the via-holes 125 and the conductive sectors 115.

Figure 1G:
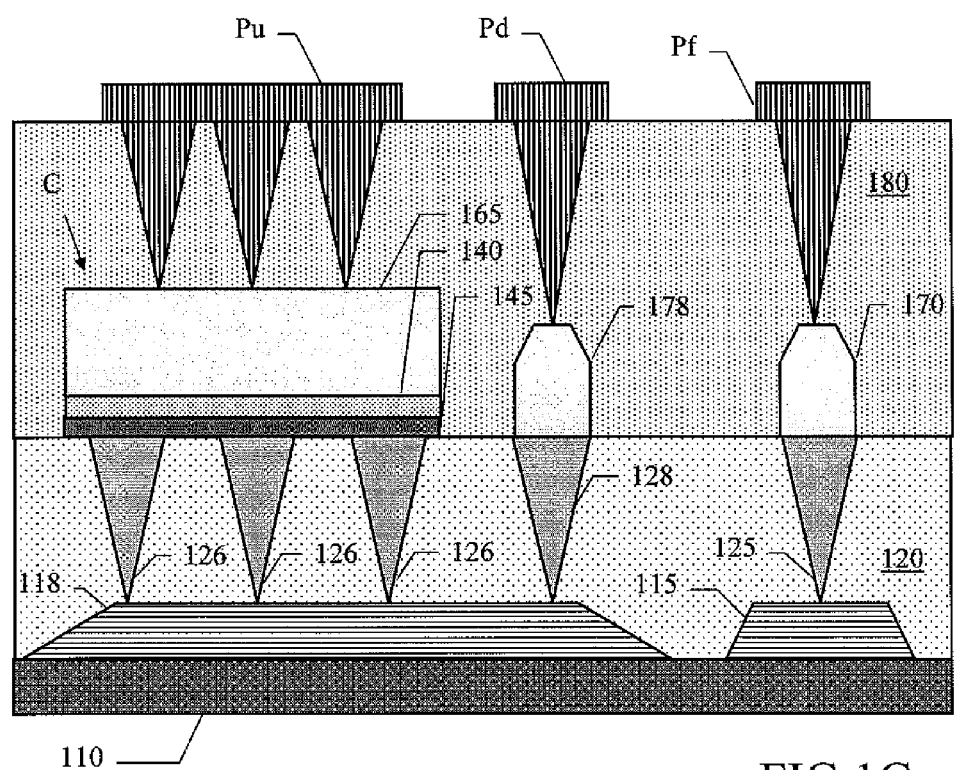

The process continues in FIG. 1G, wherein on the whole structure so far obtained there is deposited a layer of insulating material 180, commonly called Inter-Metal Dielectric, IMD, which is used for electrically insulating and protecting the bottom plate 145, the top plate 165 and the conductive turrets 170, 178; such protective layer 180 is then planarized, for example, through a polishing process (CMP—Chemical Mechanical Polishing).

In the protective layer 180 there are then made a contact Pd, a contact Pu and one or more contacts Pf for electrically contacting the conductive turret 178 (and thus the bottom plate 145), the top plate 165, and corresponding conductive turrets 170 (and hence the corresponding functional components); each one of such contacts Pd, Pu and Pf includes a via-hole being formed in the protective layer 180, which is connected to a conductive pad being arranged on an exposed surface of the protective layer 180.

Therefore, in the above-described embodiment of the present invention, the plates of the capacitor C are reversed compared to the structures being known in the art. In particular, the top plate 165 is now obtained from a portion of the metal layer of the integrated device (being already used for distributing signals and/or power supply between its functional components), while the bottom plate 145 is obtained from a portion of a dedicated layer of metal material. This allows obtaining many advantages.

Firstly, the bottom plate 145 may be made with a very low thickness. In fact, the bottom plate 145 is contacted by the via-holes 126 being previously formed below it, so that there is no risk of a perforation thereof. In general, the thickness of the top plate 165 (typically of the order of 500-800 nm) will be greater than that of the bottom plate 145. For example, the thickness of the top plate 165 is equal to 1.2-5 times, preferably equal to 1.5-3 times, such as equal to 2 times the thickness of the bottom plate 145; in absolute terms, the thickness of the bottom plate 145 may be lower than 300 nm, preferably lower than 200 nm, and even lower than 100 nm (such as equal to 50-80 nm).

As a consequence, a height difference between the top plate 165 and the conductive turrets 178, 170 (contacting the bottom plate 145 and the functional components of the integrated device, respectively) is limited; this allows making the via-holes for the corresponding contacts Pd, Pu and Pf more easily in a single etching operation.

It should be noted that such result is obtained without requiring any additional step, since there is still used the metal layer being already used in the known process of manufacturing of the capacitors (with the only difference that such metal layer is used to form the top plate 165 instead of the bottom plate 145).

In addition or in alternative, in another embodiment of the present invention, the layer of metal material from which there is derived the bottom plate 145 of the capacitor C is made of a refractory material; a refractory material has a melting point, defined as the value of temperature and pressure at which solid and liquid phases coexist in thermodynamic equilibrium, being higher than the values of the melting points of the traditional metals.

Advantageously, the layer of refractory material from which the bottom plate 145 of the capacitor C is made, at room pressure (i.e., 760 Torr) has a melting temperature being higher than 500° C., and preferably higher than 800° C. (for example, higher than 850° C.); in particular, such melting temperature is between 500° C. and 1500° C., preferably between 800° C. and 1300° C., and even more preferably between 850° C. and 1200° C. Conductive materials that exhibit such features are, for example, metals and alloys containing Nitride (for example, $Ti_xN_y$, TaNTa, $Ti_x$, TiN, $W_xN_y$, $Hf_xN_y$).

In this way, it is possible accordingly to increase a deposition temperature of the layer of insulating material from which there will be derived the dielectric layer 140 (with such deposition that should however occur at a temperature being lower than the melting temperature of the layer of refractory material on which it is deposited). As a consequence, the layer of insulating material may be deposited at high temperatures (without the risk of melting the layer of refractory material below it)—for example, higher than 400° C., and preferably higher than 600° C. (such as between 700° C. and 1000° C., and preferably between 800° C. and 900° C.). For example, the layer of insulating material may be deposited by using a technique being known as LPCVD (Low Pressure Chemical Vapour Deposition), which identifies a procedure that provides for gas-phase components reacting at the surface of a substrate (in this case, the layer of refractory material) to form a solid deposit. The LPCVD process is performed at low pressure (for example, between 250 mTorr and 1500 mTorr, and preferably between 300 mTorr and 1200 mTorr, such as 400 mTorr) and at high temperature (for example, between 500° C. and 1000° C., and preferably between 800° C. and 900° C., such as 850° C.).

The deposition of the layer of insulating material 135 at high temperatures has a positive effect on the chemical and mechanical properties of the corresponding dielectric layer, with a consequent improvement of its insulating properties.

The various steps of a production process of an integrated device including a capacitor (for example, of the MIM-type) according to another embodiment of the invention are illustrated in FIG. 2A-2G.

Figure 2A:
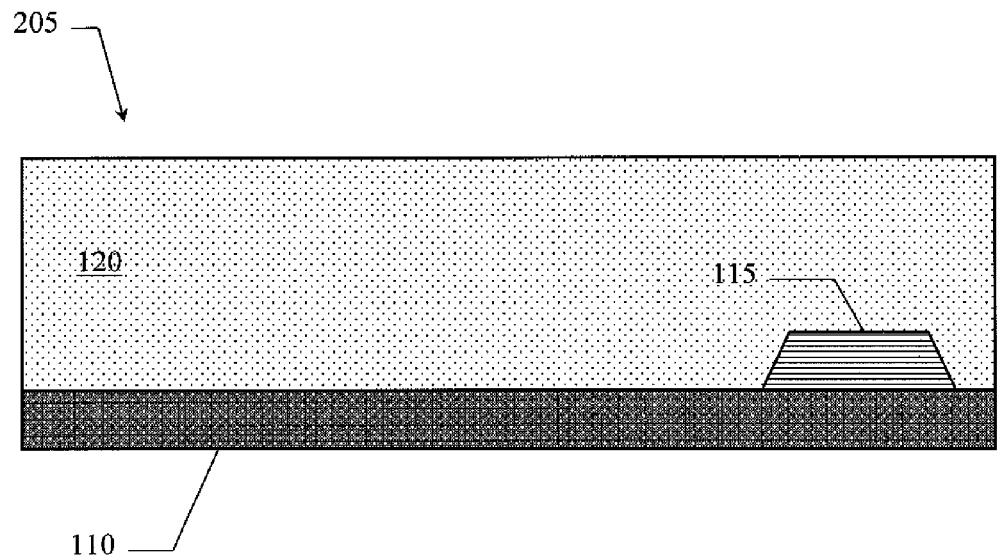

Considering in particular FIG. 2A, the description of the production process begins once a functional substrate 205 is obtained. As above, such functional substrate 205 includes the operative layer 110 (which includes the functional components of the integrated device), the conductive sectors 115 (for electrically connecting the functional components included in the operative layer 110), and the pre-metal layer 120 (but without any conductive sector for contacting the bottom plate of the capacitor).

Figure 2B:
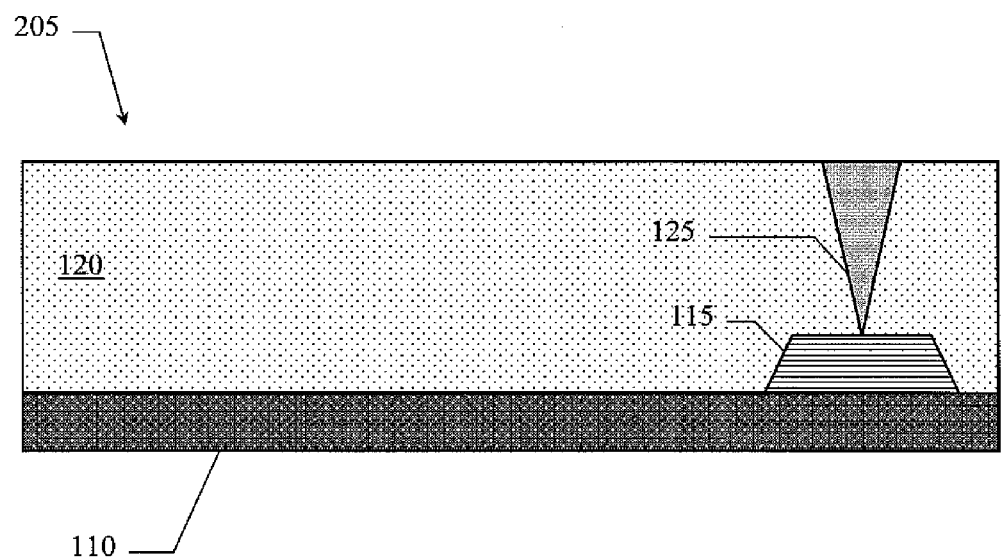

Turning now to FIG. 2B, in the pre-metal layer 120 of the substrate 205 there are similarly made the via-holes 125 for contacting the conductive sectors 115 (and thus the functional components included in the operative layer 110).

Figure 2C:
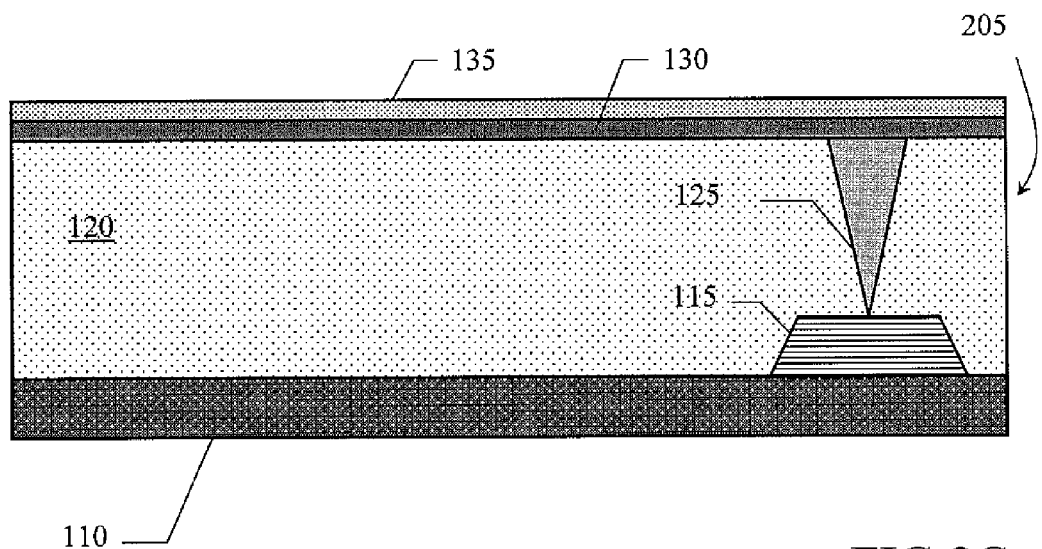

With reference now to FIG. 2C, the production process continues with the deposition on the functional substrate 205 of the layer of metal material 130, on which the layer of insulating material 135 is then deposited.

Figure 2D:
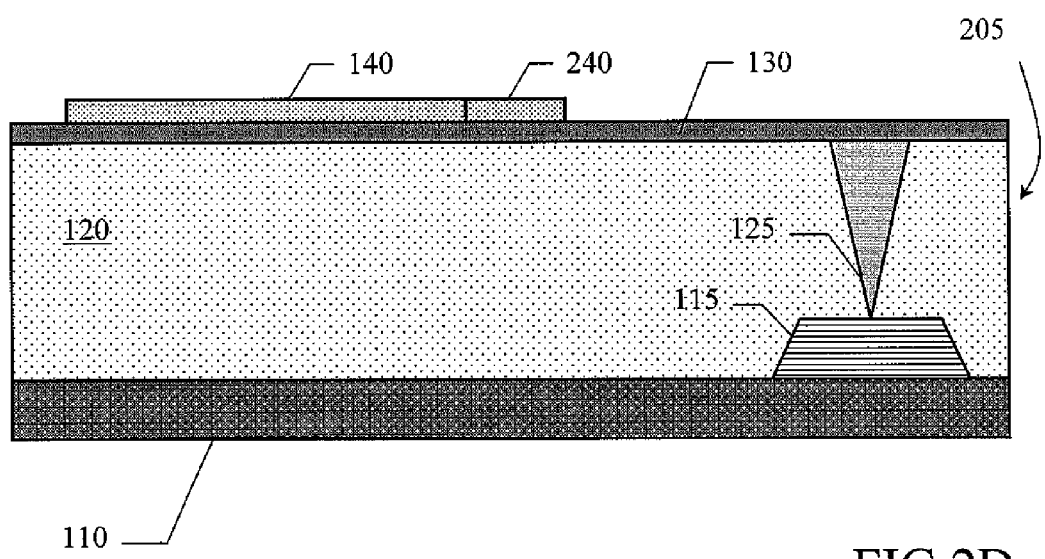

Subsequently, the layer of insulating material 135 is patterned through a masking and etching operation. The result of such operation is illustrated in FIG. 2D after the stripping of the respective mask, in which the dielectric layer 140 of the capacitor and an extension thereof 240 have been obtained. For example, the extension 240 is a tab (with a width of 1-2 μm), which extends beyond the dielectric layer 140 by 5-10 μm.

Figure 2E:
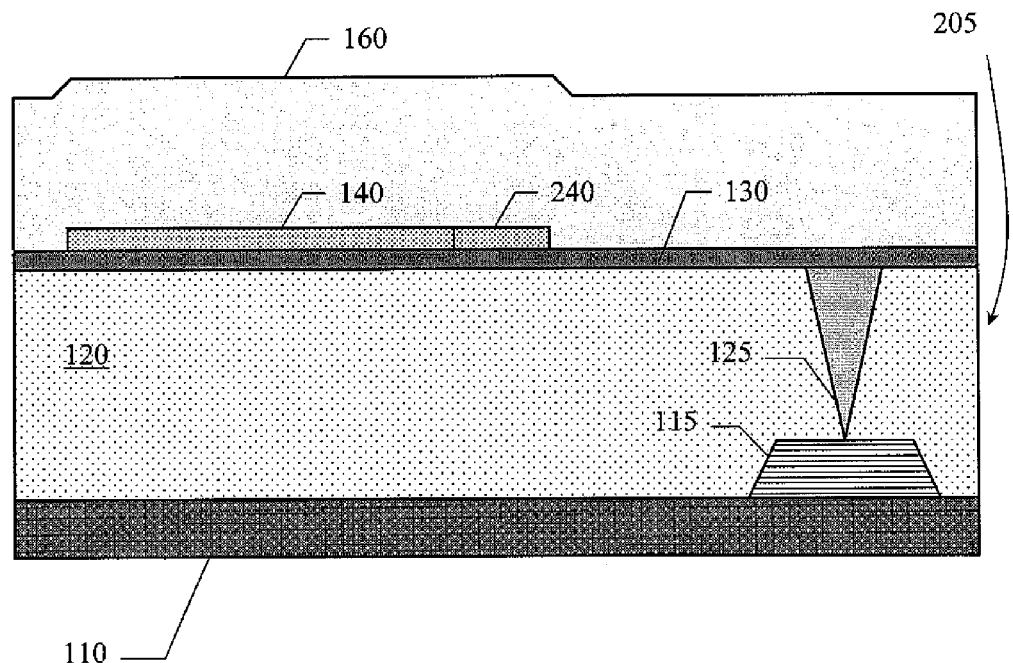

The process continues in FIG. 2E, with the deposition of the metal layer 160 on the dielectric layer 140 and on its extension 240, and on portions of the layer of metal material 130 being not covered by them. Subsequently, the metal layer 160 is patterned through a masking and etching operation; a further etching operation is then used to remove exposed portions of the layer of metal material 130.

Figure 2F:
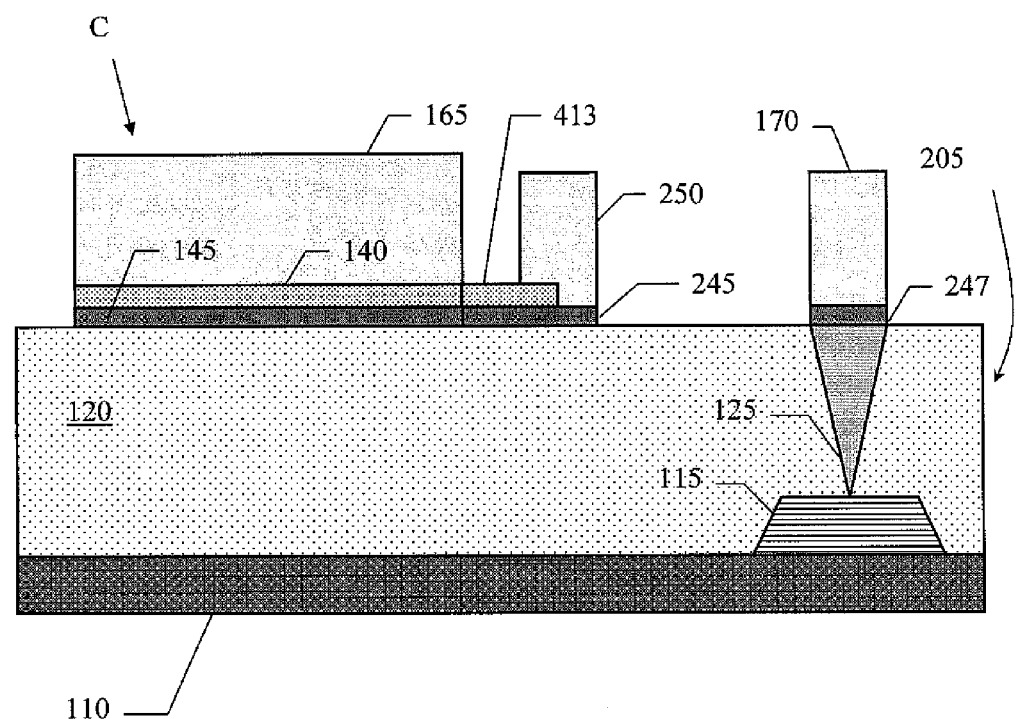

The result of such operations is shown in FIG. 2F after the stripping of the respective mask. As it can be seen, a remaining portion of the layer of metal material 130 on the functional substrate 205 defines the bottom plate 145 of the capacitor C and an extension 245 thereof, as well as conductive sockets 247 (on the via-holes 125). The extension 245 of the bottom plate 145 is formed under the extension 240 of the dielectric layer 140 and it also extends slightly beyond it (for example, with the same tab shape having equal width and higher length by 0.7-0.9 μm). In addition, portions of the metal layer being protected by the mask during the etching operation define the top plate 165 of the capacitor (on the dielectric layer 140), the conductive turrets 170 (on the conductive sockets 247) and another conductive turret 250; such conductive turret 250 covers the extension 245 of the bottom plate 145 being not covered by the extension 240 of the dielectric layer 140, and a border portion of the latter alongside the extension 245 of the bottom plate 145 (for example, by 0.1-0.3 μm).

Therefore, the conductive turret 250 is electrically connected to the bottom plate 145 of the capacitor C through the corresponding extension 245. It should be noted that the formation of the conductive turret 250 on part of the extension 240 of the dielectric layer 140 ensures the continuity of the connection of the conductive turret 250 to the bottom plate 145; in fact, the extension 240 of the dielectric layer 140, extending till under the turret 250, covers, thereby protecting it, a portion of the extension 245 of the bottom plate 145 (between the dielectric layer 140 and the conductive turret 250), which otherwise would risk to be removed during the above-described etching operation of the exposed portions of the layer of metal material 130.

Figure 2G:
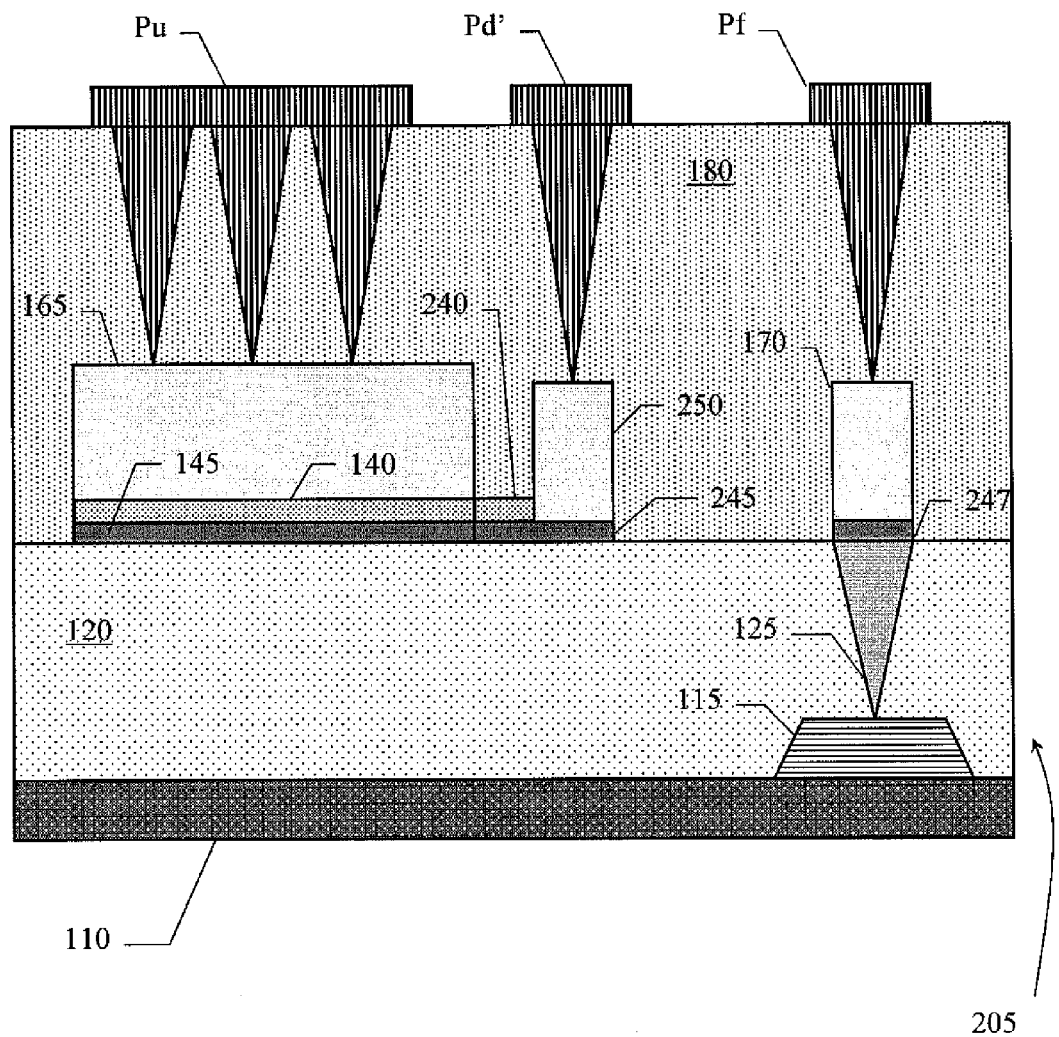

The process continues in FIG. 2G, in which on the whole structure so far obtained there is deposited and planarized the protective layer 180.

In the protective layer 180 there are then made the contacts Pu and Pf (for electrically contacting the top plate 165 and the functional components), and a contact Pd' (analogously formed by a via-hole and a conductive pad) for electrically contacting the conductive turret 250 (and thus the bottom plate 145 through the corresponding extension 245).

The above-described embodiment has all the above-cited advantages (that is, the possibility of forming the bottom plate with a lower thickness with respect to the top plate and/or the possibility of forming the bottom plate of a refractory material so as to be able to use temperatures being conveniently high in the next processes).

Furthermore, such embodiment has the additional advantage that it does not need a conductive path in the insulating layer of the functional substrate for contacting the bottom plate 145. This involves greater implementation simplicity of the production process.

Naturally, in order to satisfy local and specific requirements, a person skilled in the art may apply to the solution described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, the same solution may even be practiced without the specific details set forth in the preceding description for providing a more thorough understanding thereof; on the contrary, well known features may have been omitted or simplified in order not to obscure the description with unnecessary particulars. Moreover, it is expressly intended that specific elements and/or method steps described in connection with any disclosed embodiment of the invention may be incorporated in any other embodiment as a matter of general design choice.

In particular, the above-described production processes of the capacitor are merely illustrative and in no way limitative. For example, the same result may be obtained with equivalent processes (by using similar steps, removing some steps being not essential, or adding further optional steps); moreover, the steps may be performed in different order, concurrently or in an interleaved way (at least partly).

Similar considerations apply if the capacitor is of another type (for example, MOM), or if the plates are made of another conductive material (including a non-metal one).

Nothing prevents forming the dielectric layer in any other way—for example, by depositing the corresponding insulating layer on the bottom plate being already patterned; similarly, the second plate as well may be formed in any other way—for example, by depositing the corresponding metal layer on the layer of insulating material before the patterning of the dielectric layer.

In addition, the bottom plate may also have a thickness being equal to or greater than the upper plate has.

Of course, the two plates of the capacitor may be made with different ratios between their thicknesses.

In any case, the proposed values of the thickness of the bottom plate are merely indicative (for example, they may vary with the used production process and/or with the available technology).

The same considerations apply if the bottom plate has a different melting temperature (compatible with the subsequent deposition process).

In any case, the deposition of the layer of insulating material may occur at different pressures and/or temperatures.

Similar considerations apply if the top plate has a different melting temperature—for example, in case that there are provided (after the formation of the capacitor) further processes at high temperature.

The same considerations apply if the deposition of the layer of insulating material is performed by using other techniques, such as "Chemical Vapour Deposition" (CVD) or "Electrical Physical Chemical Vapour Deposition" (PECVD), or more generally if the dielectric layer is formed in any other way.

Similar considerations apply if the bottom plate is connected to the corresponding turret on the conductive functional substrate differently.

The extension of the bottom plate may have any other shape and/or size; moreover, nothing prevents forming such structure in any other way; in particular, the extension of the bottom plate may also be equal to the extension of the dielectric layer (with the corresponding turret that contacts the bottom plate of the capacitor laterally). Furthermore, the extension of the dielectric layer on the extension of the bottom plate may also be not present (for example, by using proper protective masks).

Similar considerations apply if the conductive sockets are not provided; in this case, the conductive turrets may be formed directly on the functional substrate (without any conductive socket); vice-versa, a conductive socket may also be provided below the turret for contacting the bottom plate of the capacitor.

Moreover, similar considerations apply if the integrated device has a different structure or includes equivalent components; moreover, the elements may be separated from each other or combined together, in whole or in part. For example, each element of the integrated device may have any shape and/or size, and may be formed of any other material.

Furthermore, the integrated device may be provided with multiple metal layers; for example, the integrated device may be covered by a further layer of insulating material, in which there are then formed via-holes being electrically connected to an external surface of the integrated device. The same procedure may be repeated in a similar way for further metal layers. In this way, it is possible to integrate several capacitors and different or additional components within the integrated device; in particular, the MIM capacitor of the solution according to the described embodiment may be integrated with other types of capacitors, such as standard capacitors, being formed, for example, in upper metal layers of the integrated device.

The design of the integrated device may also be created in a programming language; moreover, if the designer does not manufacture the electronic devices or the masks, the design may be transmitted by physical means to others. In any case, the resulting integrated device may be distributed by its manufacturer in raw wafer form, as a bare die, or in packages. Moreover, the proposed structure may be integrated with other circuits in the same chip, or it may be mounted in intermediate products (such as mother boards) and coupled with one or more other chips (such as a processor or a memory).

In any case, the integrated device of the solution according to an embodiment of the invention is suitable to be used in complex systems (such as mobile phones).

Having thus described at least one illustrative embodiment of the invention, various alterations, modifications and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for producing an integrated device including a capacitor, the method including the steps of:
   providing a functional substrate comprising an operative layer including functional circuits of the integrated device, the functional substrate further comprising a pre-metal insulating layer,
   forming a first conductive layer, including a bottom plate of the capacitor, directly on the pre-metal insulating layer of the functional substrate,
   forming a layer of insulating material including a dielectric layer of the capacitor on the bottom plate,
   forming a second conductive layer on the dielectric layer and on the functional substrate, the second conductive layer including a top plate of the capacitor and functional connections to the functional circuits, wherein the second conductive layer, which includes the top plate of the capacitor, constitutes a metal interconnect layer of the integrated device,
   forming a protective layer of insulating material covering the top plate and the functional connections,
   forming a first contact for contacting the bottom plate of the capacitor, and
   forming a second contact and functional contacts for contacting the top plate of the capacitor and the functional connections, respectively, through the protective layer.

2. The method according to claim 1, wherein the bottom plate has a first thickness and the top plate has a second thickness greater than the first thickness.

3. The method according to claim 2, wherein the second thickness is at least equal to twice the first thickness.

4. The method according to claim 2, wherein the first thickness is less than 100 nm.

5. The method according to claim 1, wherein the bottom plate has a first melting temperature higher than 500° C., the step of forming a layer of insulating material being performed at a process temperature lower than the first melting temperature.

6. The method according to claim 5, wherein the process temperature is higher than 400° C.

7. The method according to claim 5, wherein the top plate has a second melting temperature lower than the first melting temperature.

8. The method according to claim 5, wherein the step of forming a layer of insulating material is performed through an LPCVD chemical vapour deposition process.

9. The method according to claim 1, wherein the functional substrate has a main surface on which the first conductive layer is formed, and wherein the second conductive layer includes a further connection to a connection region of the main surface external to the bottom plate, the step of forming the first contact including:
   forming a connection element within the functional substrate between the bottom plate and the connection region, and
   contacting the further connection through the protective layer.

10. The method according to claim 1, wherein the first conductive layer includes an extension of the bottom plate extending in plan view beyond the dielectric layer, and wherein the second conductive layer includes a further connection formed on the extension of the bottom plate, the step of forming the first contact including:
   contacting the further connection through the protective layer.

11. The method according to claim 1, wherein the first conductive layer further includes functional sockets connected to the functional circuits, the functional connections being formed on the functional sockets.

* * * * *